(12) United States Patent
Schenkewitz et al.

(10) Patent No.: US 9,488,460 B2
(45) Date of Patent: Nov. 8, 2016

(54) CAPACITIVE SENSING NODE INTEGRATION TO A SURFACE OF A MECHANICAL PART

(75) Inventors: Christian Schenkewitz, Singapore (SG); Ling Chih Daniel Teng, Singapore (SG)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/418,389

(22) PCT Filed: Jul. 30, 2012

(86) PCT No.: PCT/IB2012/053883
§ 371 (c)(1),
(2), (4) Date: Jan. 29, 2015

(87) PCT Pub. No.: WO2014/020376
PCT Pub. Date: Feb. 6, 2014

(65) Prior Publication Data
US 2015/0241195 A1   Aug. 27, 2015

(51) Int. Cl.
| | |
|---|---|
| *G01B 7/00* | (2006.01) |
| *H03K 17/975* | (2006.01) |
| *H03K 17/96* | (2006.01) |
| *G01S 17/02* | (2006.01) |
| *G01V 3/08* | (2006.01) |
| *G06F 3/0362* | (2013.01) |

(52) U.S. Cl.
CPC ............ *G01B 7/003* (2013.01); *G01S 17/023* (2013.01); *G01V 3/088* (2013.01); *G06F 3/0362* (2013.01); *H03K 17/962* (2013.01); *H03K 17/975* (2013.01); *B60K 2350/1024* (2013.01); *H03K 2217/94052* (2013.01); *H03K 2217/94063* (2013.01); *H03K 2217/94068* (2013.01); *H03K 2217/94073* (2013.01); *H03K 2217/9653* (2013.01); *H03K 2217/96066* (2013.01)

(58) Field of Classification Search
CPC combination set(s) only.
See application file for complete search history.

(56) References Cited

U.S. PATENT DOCUMENTS 4,233,593 A * 11/1980 Bigelow ............ G06F 3/03547
                                                  340/870.37
2005/0002168 A1    1/2005 Narhi et al.
(Continued)

FOREIGN PATENT DOCUMENTS

| DE | 102007003012 | 9/2008 |
|---|---|---|
| EP | 1605484 A1 | 12/2005 |

(Continued)

*Primary Examiner* — Walter L Lindsay, Jr.
*Assistant Examiner* — Jas Sanghera
(74) *Attorney, Agent, or Firm* — Cozen O'Connor (57) ABSTRACT

A motion detecting device has a stationary plastic sensor carrier. The stationary plastic sensor carrier has two sensor carrier sections and an insulation section. The carrier section has a first plastic material and the insulation section has a second plastic material. The insulation section extends between two adjacent sensor carrier sections. The sensor carrier sections and the at least one insulation section are integrally formed by a plastic molding process. Plated metal sensing surfaces are provided on the surfaces of the sensor carrier sections. Surface electrode contacts connect the plated metal sensing surface electrodes with a PCB and define at least one capacitive area between at the plated metal sensing surface electrodes. A plastic knob element is movably arranged on the plastic sensor carrier, such that the insulating plastic separator sections and the plated metal sensing surface electrodes are at least partly covered by the knob element.

26 Claims, 5 Drawing Sheets

(56) References Cited

U.S. PATENT DOCUMENTS

| | | |
|---|---|---|
| 2008/0111428 A1 | 5/2008 | Baier |
| 2009/0009491 A1 | 1/2009 | Grivna |
| 2010/0200384 A1 | 8/2010 | Tsuduki |
| 2012/0188200 A1 | 7/2012 | Roziere |

FOREIGN PATENT DOCUMENTS

| | | |
|---|---|---|
| JP | 2007-080778 A | 3/2007 |
| JP | 2008047389 A | 2/2008 |
| JP | 2013-501287 | 1/2013 |
| WO | WO 2008/132930 | 11/2008 |

* cited by examiner

CAPACITIVE SENSING NODE INTEGRATION TO A SURFACE OF A MECHANICAL PART

CROSS-REFERENCE TO RELATED APPLICATION

This is a U.S. national stage of application No. PCT/IB2012/053883, filed on 30 Jul. 2012, the content of which is incorporated herein by reference.

BACKGROUND OF THE INVENTION

1. Field of the Invention

The present application relates to the field of capacitive sensors.

2. Related Art

Capacitive sensing devices for detecting the position of a hand are commonly used in touch screens. A touchscreen panel comprises an insulator such as glass, which is coated with a transparent conductor such as indium tin oxide (ITO). As the human body is also an electrical conductor, touching the surface of the screen results in a distortion of the screen's electrostatic field, measurable as a change in capacitance. Different technologies may be used to determine the location of the touch. The location is then sent to a controller for processing.

SUMMARY OF THE INVENTION

It is an object of the present application to provide an improved capacitive sensor arrangement and a method to produce the same.

The application discloses a motion detecting device that comprises a stationary plastic sensor carrier, which is stationary with respect attachment regions for attachment to a base plate. The stationary plastic sensor carrier comprises two sensor carrier sections and an insulation section. The carrier section comprises a first plastic material and the insulation section comprises a second plastic material. The insulation section extends between two adjacent sensor carrier sections and the sensor carrier sections and the at least one insulation section are integrally formed by a plastic molding process.

Plated metal sensing surfaces are provided on the surfaces of the sensor carrier sections. Surface electrode contacts are provided for connecting the plated metal surface electrodes with a PCB. Thereby they define at least one capacitive area between at least two of the plated metal surface electrodes. A plastic knob element is movably arranged on the plastic sensor carrier, such that the insulating plastic separator sections and the plated metal sensing surface electrodes are at least partly covered by the knob element.

Advantageously, the surface electrodes are subdivided into a sensing set of surface electrodes, which are electrically isolated against each other, and a reference set of surface electrodes, which are electrically connected to each other. The electrical connection of the reference set may also be provided on a printed circuit board on which the motion detecting device is mounted.

By using a plastic sensor carrier according to the application, sensor electrodes can be produced efficiently and in a cost saving manner. In particular, this applies to three dimensional arrangements of sensor electrodes. In one embodiment, the sensor carrier sections and the insulation section are formed by a time saving and inexpensive double shot injection molding process.

The plated metal surface electrodes may comprise a copper plating for providing good conductivity. Additionally the plated metal surface electrodes may comprises a protective cover metal such as nickel. For better protection, the metal surface electrodes may also comprises an electroless nickel immersion gold plating and or and organic solderable preservative.

The at least two carrier sections may comprise Acrylnitryle-Butadien-Styrole which is durable and can be plated with electric or electroless plating, especially after preparation with an acid.

According to the application, various ways may be provided for determining a position, such as an angular positioning, of the plastic knob element.

The motion detecting device may comprise a short circuit spring that is attached to the plastic knob element. Two portions of the short circuit spring form a short circuit between two electrode surfaces in a first predefined position or positions and wherein the two portions of the short circuit spring do not form a short circuit between any electrode surfaces in a second predefined position or positions. In this way, a position of the plastic knob element can be determined easily just by evaluating a voltage potential of the electrode surfaces and without the need of a further sensor.

According to a further modification, the motion detecting device comprises a light sensor with a light source, such as an LED or a light bulb, and a light detector. The light source is attached to the plastic knob element, and the light source is mounted such that it illuminates an electrode surface in a predetermined position. The light detector is mounted such that it receives reflected light from the electrode surface in the predetermined position. Thereby, a position of the plastic knob element can be determined with a contactless sensor.

According to another modification, the motion device comprises an inductive sensor with a magnet and a coil. The magnet and the coil are attached to the plastic knob element. The magnet may be provided by a permanent magnet, by the aforementioned coil or by a second coil. Thereby, a position of the plastic knob element can be determined with a contactless sensor.

Furthermore, the motion device may comprise a gear wheel at the outside of the plastic knob element, which provided for engagement with a sensor gear wheel on a circuit board on which the motion device is mounted. The gear wheel is arranged at an outer wall of the rotary knob guide and close to a bottom surface of the rotary knob guide.

In a particular embodiment, the outer shape of the motion detecting device is designed as a protrusion with a conical shape, a frustoconical shape, a pyramidal shape or a truncated pyramid shape. The cone may have a polygonal cross section or a curved cross section or a combination of both wherein the outer boundary of the cross section comprises one or more curved lines and one or more straight lines. Such a design can facilitate a handling of the motion detecting device with the hand and can also provide a haptic feedback about the orientation of the motion detecting device.

In a further modification, the plastic knob element comprises a knob guide and a knob grip, wherein the knob grip is arranged on the knob guide. Thereby, the knob guide and the interior of the knob guide can be protected from adverse influences such as dust and liquids. The knob guide may furthermore comprise a tooth gear for engagement with a wheel.

In a further modification, a center button reflector is arranged inside the plastic knob element and an at least partially light transmissive center button cap is provided on top of the plastic knob element. Thereby, the plastic knob element can be lighted for easier orientation in the dark. The reflector helps to direct the light of an illumination at a bottom of the plastic knob element to the button cap. Especially, the lighting may be turned on when a key of a car is turned into a predetermined position.

The application furthermore discloses a motion detection interface arrangement with the abovementioned motion detecting device. The motion detection interface arrangement comprises a circuit board such as a printed circuit board with conductive paths. The conductive paths are connected to interface ports, which are electrically connected to the surface electrode contacts.

In a further embodiment, the motion detection interface arrangement comprises a latching spring, which is attached to the PCB, and a plurality of protrusions at a bottom end of the plastic knob element, wherein the latching spring engages between at least two of the protrusions. The latching spring holds the plastic knob element in a defined position and provides a haptic feedback to a user of the knob element.

In another embodiment, the motion detection interface arrangement comprises a latching spring, a latching element and a plurality of protrusions at a bottom end of the plastic knob element. The latching spring is attached to the PCB and the latching element is arranged between the protrusion and the latching spring. The latching element engages between at least two of the protrusions. By providing a latching element that is not easily deformed, the latching mechanism can be made durable.

Furthermore, the motion detection interface arrangement may comprise a wheel that is mounted on the PCB and a detector that detects a motion of the wheel, the wheel engaging with a gear on the knob element and the detector being electrically connected to a conductive path on the PCB.

The application furthermore discloses motion detection device with the abovementioned motion detection arrangement and with an electronic evaluation unit having a plurality of interface ports.

The interface ports are electrically connected with the conductive paths of the PCB. The electronic evaluation unit is configured to evaluate a state of the surface electrodes. Furthermore, it may also be configured a probe signal to the surface electrodes.

In particular, the electronic evaluation unit may be configured to detect an intentional hand contact by evaluating the strength and duration of signals from the electrode surfaces via the interface ports. Furthermore, the electronic evaluation unit may be configured to detect a finger position by evaluating signals from the electrode surfaces via the interface ports.

Moreover, the electronic evaluation unit may be configured to detect if a hand is covered by a material, for example a glove, by evaluating the strength of signals from the electrode surfaces via the interface ports during an approach of the hand and during the hand contact. The approach and the contact are detected by the time dependence and pattern of the signals. This is especially advantageous in a passenger compartment of a car during winter.

Moreover, the electronic evaluation unit may be configured to detect a rotational position of the knob element by detecting a short circuit between two of the electrode surfaces and by detecting the absence of a short circuit between electrode surfaces. The short circuit may be detected by measuring a voltage difference, for example.

Moreover, the electronic evaluation unit may be configured to detect a rotational position of the knob element by evaluating an electric signal from a coil via conductive paths of the PCB, wherein the coil is attached to the knob element.

Moreover, the electronic evaluation unit may be configured to detect a rotational position of the knob element by evaluating an electric signal from a light detector via conductive paths of the PCB, the light detector being attached to the knob element.

Furthermore, the application discloses a vehicle, especially a motorized vehicle such as a passenger car, with the above-mentioned motion detection device, wherein the motion detection device is integrated into an operating panel that is provided in a passenger compartment of the vehicle, the electronic evaluation unit of the motion detection device is electrically connected to a device of the vehicle, such as a climatization device, a passenger information and/or entertainment device, a window lifter, rear mirror adjustment device, a sliding roof motor etc.

Furthermore, the application discloses a method for producing a cylindrical capacitive sensor arrangement. A first shot molded plastic part is injection molded. A platable plastic material is provide and a second shot molded plastic part is injection molded from the platable plastic material. The second shot molded plastic part is plated in a metallization step. Therein, the mold form for molding the second shot molded plastic part is designed such that the second shot molding part comprises strip shaped platable regions. Electrical contacts to the strip shaped platable regions are formed. In particular, the strip shaped regions may be aligned parallel to a symmetry axis of a cylinder. The injection molding of the first shot molded plastic part and the second shot molded plastic part may be performed simultaneously or also one after the other.

BRIEF DESCRIPTION OF THE DRAWINGS

The application is now explained in further detail with respect to the following Figures in which.

In the following description, details are provided to describe the embodiments of the application. It shall be apparent to one skilled in the art, however, that the embodiments may be practiced without such details.

DETAILED DESCRIPTION OF THE PRESENTLY PREFERRED EMBODIMENTS

Figures 1, 2:
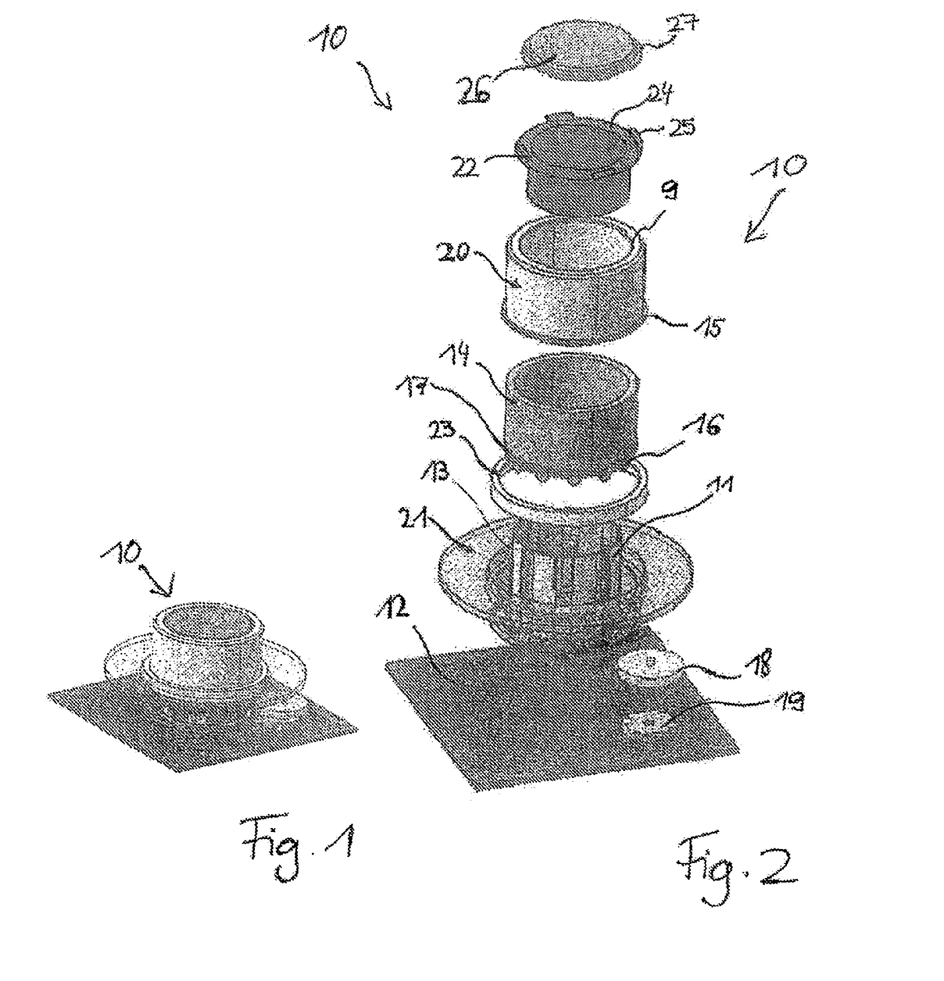
FIG. 1 shows a capacitive sensing knob according to the application.
FIG. 2 shows an exploded view of the capacitive sensing knob of FIG. 1.

A capacitive sensing knob 10 according to the application comprises a cylindrical sensor arrangement 11 of strip shaped sensor electrodes 13, which is connected to a circuit board 12. The sensor electrodes 13 are also known as sensor surfaces 13. A cylindrical rotary knob guide 14 is arranged concentrically around the cylindrical sensor arrangement 11.

Rounded latch protrusions 16 are provided at a bottom circumference of the cylindrical rotary knob guide 14.

A tooth gear 17 is provided at the outside of the cylindrical knob guide 14. The tooth gear 17 is in contact with a disk shaped encoder gear 18, which is supported on an encoder 19 on the circuit board 12. A cylindrical rotary knob grip 20 is arranged concentrically around the cylindrical knob guide 14. The cylindrical knob grip 20 comprises a lower rim 15 that protrudes to the outside and an upper rim 9 that protrudes to the inside. A cover ring 23 is supported on the lower rim of the cylindrical knob guide 14. The cover ring 23 fits into a cylindrical opening of a front plate 21.

A cylindrical center button reflector 22 is arranged concentrically inside of the cylindrical sensor arrangement 11, of the rotary knob guide 14 and of the rotary knob grip 20. An upper rim 24 of the center button reflector 22, which projects to the outside, comprises four catches 25 that are arranged equidistantly on the upper rim 24. A center button cap 26 is provided on top of the center button holder 24. The center button cap 26 comprises a lower rim 27 that fits into the catches 25 of the center button reflector 22.

In the embodiment of FIGS. 1 and 2, the cylindrical sensor arrangement 11 is provided by a double shot plastic part, which comprises a platable portion and a non-platable portion. Herein, a double shot plastic part refers to a plastic part that is produced by a double shot injection molding process. In particular, the sensor electrodes 13 and electrical connections to the sensor electrodes 13 are provided on the platable portion and non-conducting connecting regions between the sensor electrodes, which form a scaffold for the sensor electrodes, are provided on the non-platable portion.

The platable portion is plated with a conducting material, such as chrome. Alternatively, the platable portion may also be plated with any other material that is applied in a metallization process, such as electroless plating or galvanic plating. In the art, the electroless plating is also known as chemical or autocatalytic plating and the galvanic plating is also known as electroplating.

In a one embodiment, the sensor electrodes 13 of the cylindrical sensor arrangement are generated by masking out non-sensor areas of a plastic part, removing the masking substance and plating of the remaining areas. Herein, a photo-activatable plastic may be used which becomes platable after illumination with light of a suitable wavelength. Instead of a masking substance, a mask may be used to selectively illuminate portions of the plastic part.

A production method for a capacitive sensor arrangement according to the application is often cheaper to realize than providing an elastic foil with sensor electrodes. This applies especially in situations in which capacitive sensors are provided on curved or otherwise protruding surfaces such as cylinders, pyramids, wedges etc.

In a double-shot molding production process according to the application, a first shot comprises a non-platable material, such as polycarbonate, and a second shot comprises a platable grade material, such as Polycarbonate/Acrylnitryle-Butadien-Styrol (PC/ABS) doped with palladium, which forms the base for the capacitive sensors. During a chromic acid etching step, the surface of the platable second shot material is activated. In a metallization step, the sensor electrodes are metallized with electroless copper plating. The copper may be further covered with a electroless nickel immersion gold (ENIG) plating, wherein the surface is activated with the a solution of a noble metal such as palladium chloride.

According to another embodiment, a production process for a cylindrical capacitive sensor comprises 1-shot injection molding and laser activation. In a molding step, a doped thermoplastic is injection molded. In a step of laser activation, a laser beam activates the thermoplastic, which is doped with an additive. Metallic nuclei are formed which act as a catalyst for reductive copper plating. The laser also creates a microscopically rough surface in which copper is kept in place during metallization. A step of metallization comprises a cleaning step and a plating step that comprises plating with electroless copper baths. In a finishing step, the copper surface is plated with a cover metal such as nickel, gold, Sn, Ag, Pd/Au, an organic solderable preservative (OSP) or others.

In the assembled state shown in FIG. 1, the center button reflector 22 rests on the rotary knob guide 14. The center button reflector 22 and the lower rim 27 of the center button cap 26 are covered by the rotary knob grip 20. The sensor electrodes 13 of the cylindrical sensor array 11 are connected to an evaluation unit via connecting lines. The connecting lines and the evaluation unit are not shown in FIGS. 1 and 2. During operation, the center button reflector 22 reflects the light of a lamp that is not shown in FIGS. 1 and 2. For example, the lamp may be placed inside of the center button reflector and reflect light through the center button cap 26.

If the rotary knob grip 20 is turned, the rotary knob guide 14, the center button reflector 22 and the center button cap 26 rotate together with the rotary knob grip 20 against the cylindrical sensor array 11, which is stationary with respect to the circuit board 12. The tooth gear 17 turns the encoder gear 18 and the encoder 19 generates an electric signal, which depends on the movement of the tooth gear 17.

Furthermore, a voltage of the individual sensor electrodes 13 of the cylindrical sensor arrangement 11 is measured by the evaluation unit. If a conducting object, an electrically charged object or an object with dielectric properties approaches the rotary knob grip 20, an electric field between the object and adjacent sensors 11 and a charge on the adjacent sensors 11 changes. The change of charge causes a change in voltage, which is detected by the evaluation unit. In this way, the evaluation unit can detect the presence of the object. By evaluating the detected voltage pattern, the evaluation can also detect the presence of several objects and the movement of those objects. In particular, the objects can be fingers of the hand of a user.

The evaluation unit together with the sensors connected to it, such as the sensors 11, forms a human machine interface (HMI). According to the application, a detection of fingers of a user can trigger various functions such as an illumination of a unit, switching to a menu screen that is useful for the user or for others.

The evaluation unit may also detect motion patterns of the fingers such as a click, a double-click or movement of the fingers relative to each other and attribute special functions to the motion patterns. One such motion pattern could be generated by keeping the thumb in position while moving another finger around the rotary button grip 20 or away and towards the rotary button grip 20.

Especially in an automotive environment, it can be advantageous to provide a button with multiple functions. Thereby, it is possible for a driver to keep the hand in one location while operating the various functions. Especially for a tuning button of a car radio, the turning motion can be used for manual browsing through the available frequencies, a click movement could be used to stop and start a frequency sweep and another motion could be used for saving and deleting stored frequencies of radio stations. A relative movement of the fingers can be used to adjust a loudspeaker volume while other finger movements can be used to switch to and from various modes such as a traffic message mode, a loudspeaker volume distribution etc.

According to the application, various methods may be used to measure a charge on the capacitor surfaces. In one embodiment, a relaxation oscillator is used. In other embodiments, a current versus voltage phase shift measurement, a resistor-capacitor charge timing, a capacitive bridge divider, a charge transfer, a successive approximation, sigma-delta modulators, charge-accumulation circuits, a field effect, a mutual capacitance, or a frequency shift may be used.

In a glove detection mode, the capacitive sensor array can be configured to detect if a passenger of a car is wearing gloves and, in this case, the sensitivity of the sensor array is increased, for example by increasing an alternating current detection signal that is fed to a capacitor electrode 13. The glove detection may be dependent on a temperature signal from an interior temperature sensor. For example, a glove detection may be made active for cold temperatures only.

The capacitor electrodes of the cylindrical capacitive sensor arrangement may be connected in various ways. In one embodiment, capacitors are formed by two adjacent capacitor surfaces. One of the adjacent capacitor surfaces of a capacitor is connected to a ground potential while the other one of the adjacent capacitor surfaces is connected to a voltage measuring input of a microprocessor. Alternatively, a switch, such as a semiconductor switch, may be provided for connecting different capacitor surfaces to the same voltage measuring input. In this way, a number of voltage measuring inputs of a microprocessor can be made smaller than a number of capacitors of the cylindrical capacitive sensor array. Capacity measurements of the capacitors are then performed by scanning the capacitors in turn using the switch.

Figure 3:
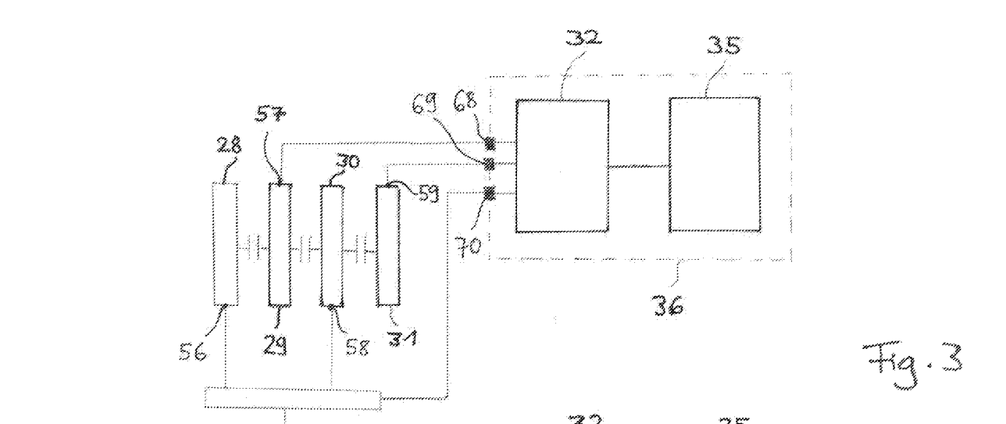
FIG. 3 shows an electric circuit of the capacitive sensing knob of FIG. 2.
Figure 4:
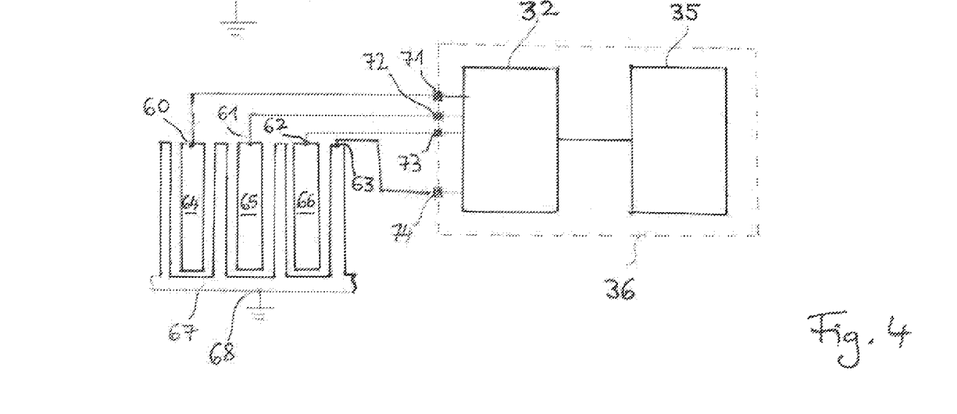
FIG. 4 shows a second electric circuit layout of the capacitive sensing knob of FIG. 2.

FIGS. 3 and 4 show different circuit layouts for the capacitive sensing knob 10. For simplicity, only a small number of capacitor electrodes is shown in FIGS. 3 and 4. In a first embodiment, which is shown in FIG. 3, the ground-connected capacitor electrodes are separately connected to lines on the circuit board 12, which are connected to a ground potential. The first embodiment has the advantage that fewer connection lines are required on the circuit board 12. The second embodiment, on the other hand, allows determination of the wiring of the capacitor by the design of the circuit board 12 or even changing the wiring dynamically by actuating switches on the circuit board 12. Electrode contacts 56, 57, 58, 59 are provided for connecting the sensing electrodes 29, 31 and the ground electrodes 28, 30 to the circuit board 12.

FIG. 3 shows an electric circuit, which comprises a capacitive sensing similar to the one shown in FIG. 2. By way of example, FIG. 3 shows four adjacent sensor electrodes 28, 29, 30, 31. The sensor electrodes 28, 29, 30, 31 correspond to capacitor plates of three capacitors that comprise the sensor electrodes 28 and 29, 29 and 30, and 30 and 31, respectively. Furthermore, they correspond to the sensor electrodes 13 of FIG. 2. Capacities between the sensor electrodes 13 are symbolized by capacitor symbols in FIG. 3. The arrangement of sensor electrodes 13 is circular, such that sensor electrode 31 is adjacent to sensor electrode 28 and a fourth capacitor is formed between the sensor electrodes 31 and 28.

In the arrangement of FIG. 3, the sensor electrodes are alternately connected to ground and to a voltage sensing input of a capacitance sensing device 32. Every second sensor electrode 29, 31 is connected to a separate voltage sensing input 68, 69 of the capacitance sensing device 32 while the ground potential is connected to a reference input 70 of the capacitance sensing device 32. The sensing input and the reference input are also referred to as interface ports.

In particular, the sensor electrode 29 is connected to voltage sensing input 68 and the sensor electrode 31 is connected to voltage sensing input 69 of the capacitance sensing device 32. The capacitance sensing device 32 is connected to a decision logic 35, which is arranged together with the capacitance sensing device 32 on a printed circuit board 36. During a capacitance measurement, a current signal is provided to a capacitor electrode via one of the voltage sensing inputs. After providing the current signal, a response signal is detected at the voltage sensing input. The decision logic 35 evaluates the change in capacitance and determines a finger distance and/or position.

FIG. 4 shows a second layout in which reference electrodes, which are connected to ground potential, are connected with each other on a plastic part. Similar to FIG. 3, the reference electrodes are arranged between sensing electrodes, which are electrically isolated to each other and to the ground potential. In the embodiment of FIG. 4, the ground-connected capacitor electrodes are connected among each other to a compound ground electrode 67, for example by a conductive part of the plastic part or by a conductive strip. The compound ground electrode 67 is connected via an electrode contact 68 to a connection line on the circuit board 12 that is connected to a ground potential. Further electrode contacts 60, 61, 62 are provided for connecting the sensing electrodes 64, 65, 66 to the circuit board. A further contact 63 is provided for connecting the compound ground electrode 67 to the capacitance sensing device 32.

In a modified embodiment, the compound ground electrode may be grounded via the capacitance sensing device 32. In this case, the contact 68 may be omitted. In a further modification, the compound ground electrode 67 and the capacitance sensing device 32 are separately grounded. In this case, the contact 63 may be omitted. Similar alternatives apply to the embodiment of FIG. 3.

Figure 5:
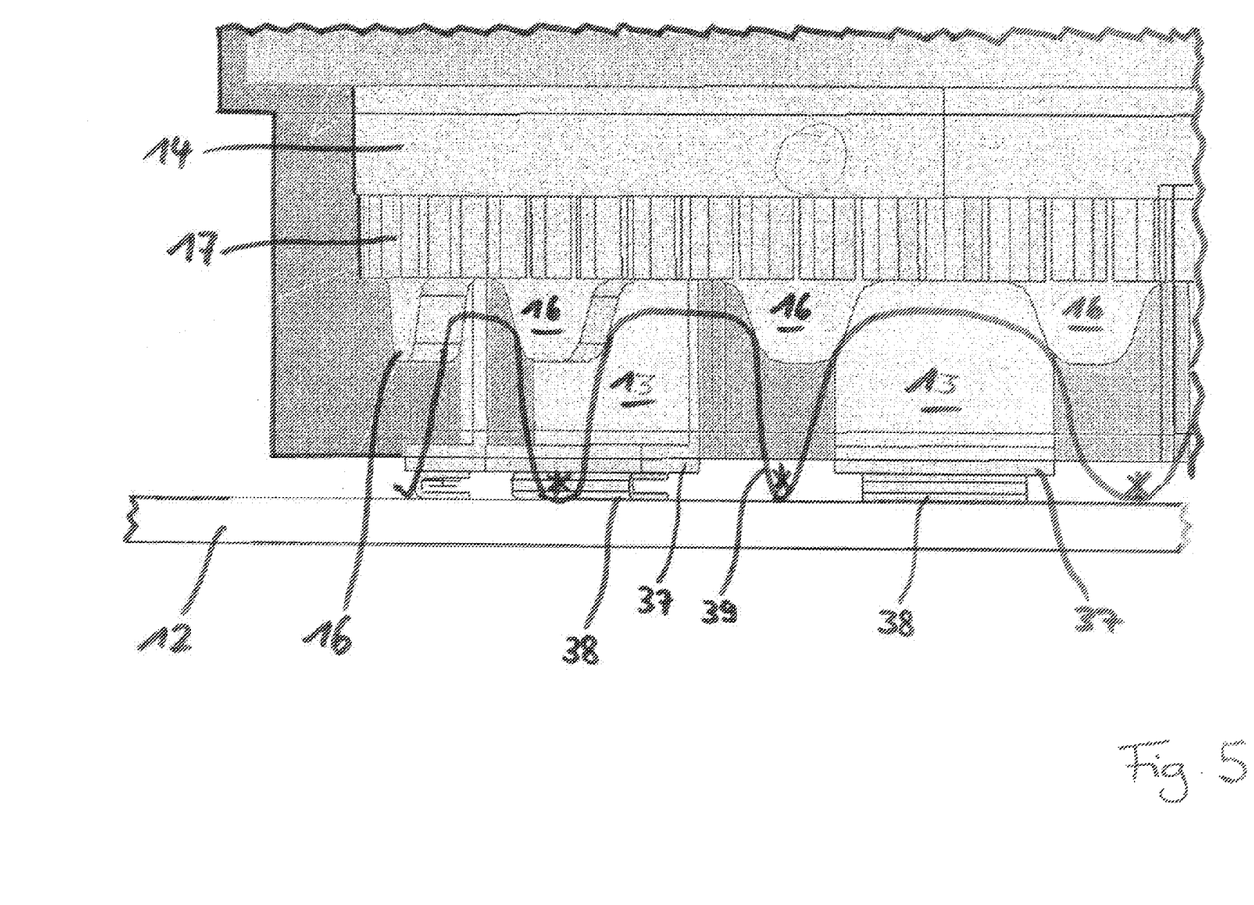
FIG. 5 shows a partial view of a bottom portion of the capacitive sensing knob.

Similar to the embodiment of FIG. 3, sensor electrodes 64, 65, 66 are connected to sensing inputs 71, 72, 73 and the compound ground electrode 67 is connected to a reference input 74. FIG. 5 shows a perspective sectional view of a bottom region of the capacitive sensing knob 10. The sensor electrodes 13 are mounted on the plated portion of front plate 21. The contacts are heat staked or otherwise mounted and electrically connected to the front plate 21. The contact springs 38 provide for balancing out tolerances and height differences. A circular latch spring 39 is provided below the latch feet 16. The circular latch spring 39 is attached to the circuit board 12, either directly or indirectly via a cylindrical casing which is not shown in FIG. 1. By way of example, the attachment of the circular latch spring 39 is shown as a screw connection.

In a latch position of the capacitive sensing knob 10, the circular latch spring 39 engages into spaces between the latch feet 16. Thereby, the capacitive sensing knob 10 takes on one of several latch positions when it is not turned. In particular, the capacitive sensing knob 10 is not moved out of position by vibrations of an automobile. A user needs to overcome a spring resistance to move the capacitive sensing knob 10 from one latch position to an adjacent latch position. Thereby, the circular latch spring 39 provides a haptic feedback to the user and a better control of the turning angle. This can be useful for a tuning knob of a car radio, for example.

In a further embodiment, the haptic feedback is provided by a circular plastic part with a surface form that matches the latch feet 16. This plastic part is pressed toward the latch feet 16 from the circuit board 12 with a spring. In this way, the spring does not need to match the form of the latch feet and a lasting deformation of the spring affects the function only marginally.

Figure 6:
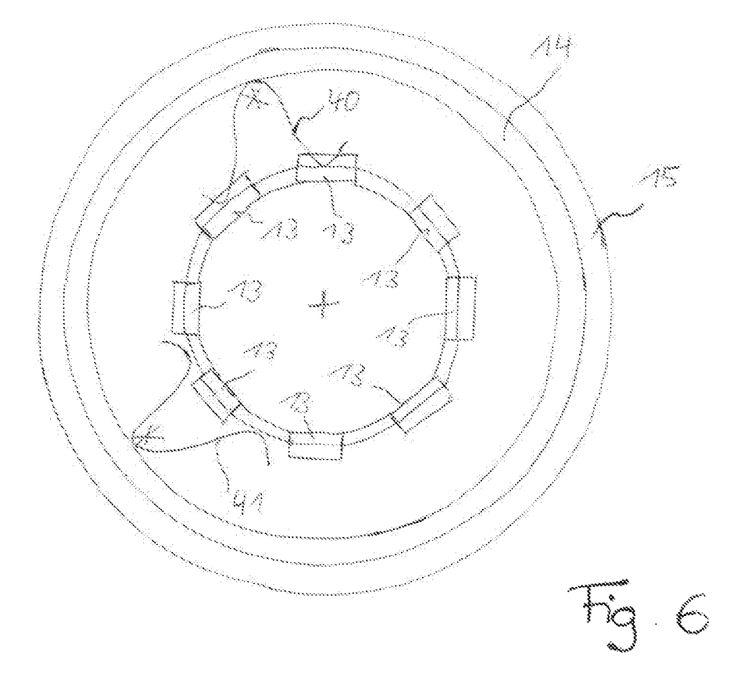
FIG. 6 shows a cross section through the capacitive sensing knob.

FIG. 6 shows a top view of a bottom section of the capacitive sensing knob 10. For clarity, relative radial distances have been exaggerated in FIG. 5.

A short-circuit spring 40, which is made of a conducting material, is attached to an inner wall of the rotary knob guide 14. The dimension of the short-circuit spring 40 is made such that, in one of several pre-determined positions, a first portion of the short circuit spring touches a first sensor electrode 13 and a second portion of the short-circuit spring touches a second electrode 13. Advantageously, the height of the short-circuit spring 40 is made smaller than the distance between two adjacent electrodes 13 such that the location of a finger which is placed on an outer surface of the rotary knob grip 15.

Optionally, a latch spring 41 may be provided on the inner wall of the rotary knob guide 14. The dimension of the latch spring 41 is made such that, in one of the several predetermined positions, a first portion of the latch spring 41 engages between an interstice between two adjacent sensor electrodes 13 and a second portion of the latch spring 41 engages into an interstice between two adjacent sensor electrodes 13. Different from the short-circuit spring 40, the latch spring 41 need not contain conducting material. The latch spring 41 may be provided in addition to the circular latch spring 39 of FIG. 5 or instead of the circular latch spring 39.

During operation, two adjacent electrode surfaces 13 are short circuited when the capacitive sensing knob 10 reaches one of the pre-determined positions. Thereby, the adjacent electrode surfaces 13 are forced onto the same electric potential. Especially for a circuit layout in which every second electrode surface is connected to ground potential, the two adjacent electrode surfaces 13 take on ground potential. The capacitance sensing device 32 detects which pair of adjacent electrode surfaces are on the same potential and the decision logic 35 uses this information to compute an angular position of the capacitive sensing knob 10.

According to a further evaluation method of capacitor signals, a finger detection is triggered if a potential difference between ground and a sensing electrode is between a predetermined minimum value and a pre-determined maximum value and no finger touch signal is triggered otherwise. Furthermore, an evaluation method may differentiate between an intentional contact of the capacitive sensing button and an unintentional contact. This discernment may be done based on the number of detected fingers and/or on the length of the contact. By way of example, a contact with the capacitive sensing knob 10 may be classified as intentional when the number of finger detections is between 2 and 4 and as unintentional otherwise.

Figure 7:
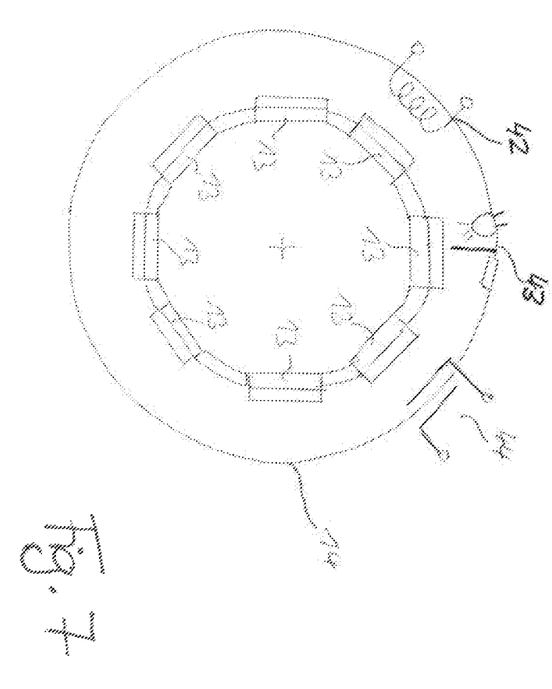
FIG. 7 shows various position sensors for use with the capacitor arrangement of FIG. 2.

FIG. 7 shows further types of position sensors 42, 43, 44 for use with the capacitive sensor array 11. The position sensors comprise an inductive sensor 42, light sensor 43 with a photodiode and a photo element and a capacitive sensor 44. Similar to FIG. 6, the position sensors 42, 43, 44 are placed at an inner wall of the rotary knob guide 14. The sensor 42, 43, 44 work contactless, but they require a separate current supply to the rotating rotary knob guide 14. A separation is provided between the light source and the photodiode to provide a direct illumination of the photodiode.

Figure 8:
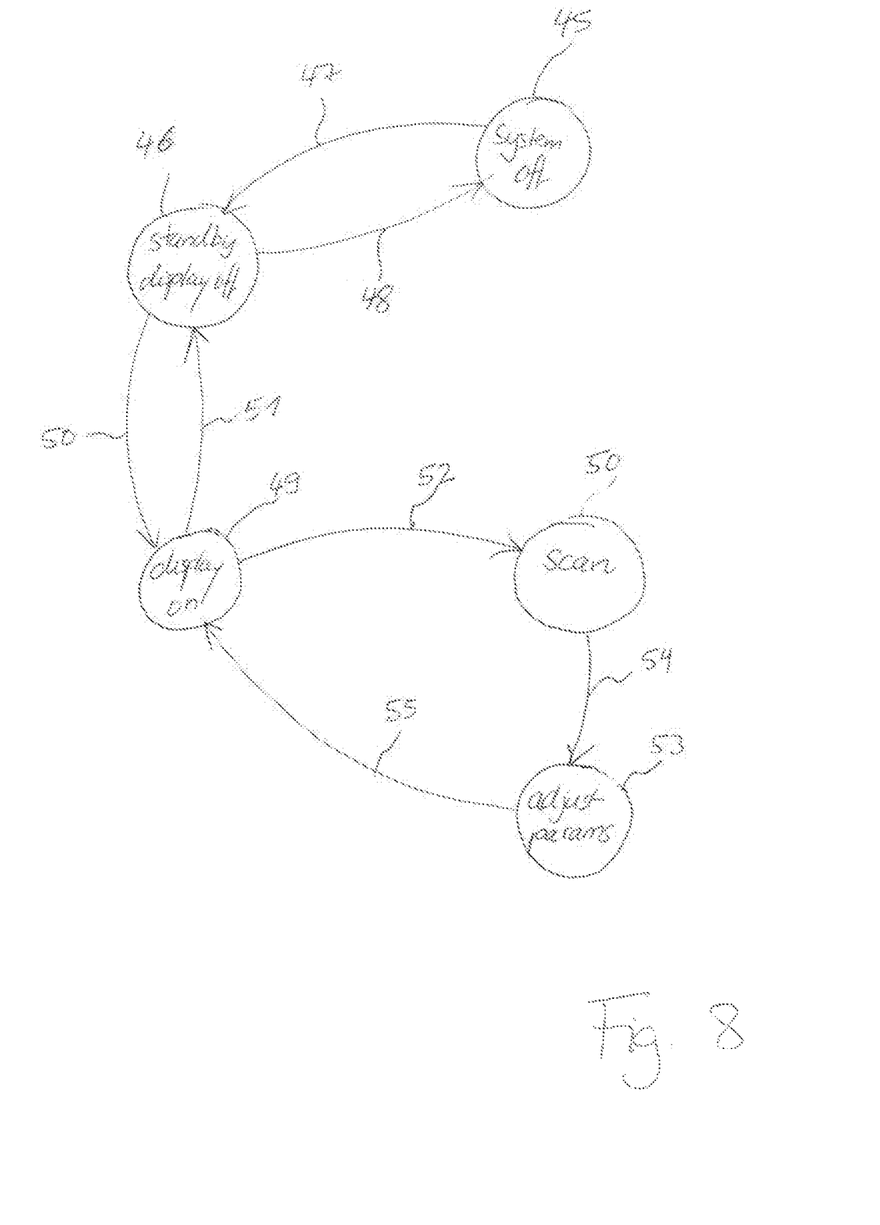
FIG. 8 shows a state diagram for the capacitive sensing knob.

By way of example, FIG. 8 shows a state diagram of the capacitive sensing knob 10. In an off state 45, a system, such as the air conditioning or the car radio, is switched off. When a car ignition is turned on, the system changes to a standby state 46 through transition 47. When the ignition is turned off, the system changes from the standby state 46 to the off state 45 through transition 48. In the standby state 46, a system display is off or is dimmed. If an intentional finger contact is detected, the system changes via transition 50 from the standby state 46 into an active state 49, in which the display is lighted. After a pre-determined period of receiving no commands, the system changes back from the active state 49 into the standby state 46 via transition 51.

If the system receives further sensor signals in the active state 49 it changes into a scanning state 50 via transition 52. In the scanning state 50, the system scans a motion of the capacitive sensing knob 10, for example by tracing a moving short circuit, wherein the short circuit is caused by a pre-determined position the short circuit spring. If a command signal such as a knob rotation or a pre-determined finger contact pattern is detected, the system changes via transition 54 into a command execution state 53, in which system parameters, such as a radio loudness or frequency, are adjusted. After adjusting the parameters, the system changes back into the active mode 49 via transition 55.

Although the above description contains much specificity, these should not be construed as limiting the scope of the embodiments but merely providing illustration of the foreseeable embodiments. Especially the above stated advantages of the embodiments should not be construed as limiting the scope of the embodiments but merely to explain possible achievements if the described embodiments are put into practice. Thus, the scope of the embodiments should be determined by the claims and their equivalents, rather than by the examples given.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A motion detecting device, comprising:
  a stationary plastic sensor carrier (11) having:
    at least two sensor carrier sections having a first plastic material and at least one insulation section having a second plastic material, the at least one insulation section extending between two adjacent sensor carrier sections, the at least two sensor carrier sections and the at least one insulation section being integrally formed by a plastic molding process,
    a plurality of plated metal surface electrodes (13) arranged on surfaces of the at least two sensor carrier sections, and
    a plurality of surface electrode contacts (56-59; 60-63) connecting the plated metal surface electrodes (13) with a PCB (12); and a plastic knob element (14, 20) movably arranged on the stationary plastic sensor carrier (11), such that the at least one insulation section and the plated metal surface electrodes (13) are at least partly covered by the knob element (14, 20).

2. The motion detecting device (10) according to claim 1, wherein the at least two sensor carrier sections and the at least one insulation section are formed by a double shot injection molding process.

3. The motion detecting device (10) according to claim 1, wherein the plated metal surface electrodes (13) comprise a copper plating.

4. The motion detecting device (10) according to claim 1, wherein the plated metal surface electrodes (13) comprise a nickel plating.

5. The motion detecting device (10) according to claim 1, wherein the plated metal surface electrodes (13) comprise an electroless nickel immersion gold plating.

6. The motion detecting device (10) according to claim 1, wherein the plated metal surface electrodes (13) comprise an organic solderable preservative.

7. The motion detecting device (10) according to claim 1, wherein the at least two carrier sections comprise Acrylnitryle-Butadien-Styrole.

8. The motion detecting device (10) according to claim 1, wherein the motion detecting device has an outer shape selected from a conical shape, a frustoconical shape, a pyramidal shape and a truncated pyramid shape.

9. The motion detecting device (10) according to claim 1, further comprising a short circuit spring attached to the plastic knob element, wherein two portions of the short circuit spring form a short circuit between two electrode surfaces in a first predefined position and wherein the two portions of the short circuit spring do not form a short circuit between any electrode surfaces in a second predefined position.

10. The motion detecting device (10) according to claim 1, further comprising a light sensor having a light source and a light detector, wherein the light source is attached to the plastic knob element, the light source being arranged such that the light source illuminates and receives reflected light from an electrode surface in a predetermined position.

11. The motion detecting device (10) according to claim 1, further comprising an inductive sensor, the inductive sensor having a magnet and a coil, the magnet and the coil being attached to the plastic knob element.

12. The motion detecting device (10) according to claim 1, further comprising a gear wheel, the gear wheel being arranged so as to engage with a sensor gear wheel on a circuit board, the gear wheel being arranged at an outer wall of the rotary knob guide.

13. The motion detecting device (10) according to claim 1, wherein the plastic knob element (14, 20) has a knob guide (14) and a knob grip (20), wherein the knob grip (20) is arranged on the knob guide (14), and wherein the knob guide has a tooth gear (17).

14. The motion detecting device (10) according to claim 1, further comprising a center button reflector (24) arranged inside the plastic knob element (14, 20), and a center button cap (26) arranged on top of the plastic knob element (14, 20).

15. A motion detection interface arrangement (10) comprising:
a motion detecting device according to claim 1; and
a PCB with conductive paths having a plurality of interface ports (68-70; 71-74), the surface electrode contacts being electrically connected with the interface ports.

16. The motion detection interface arrangement (10) according to claim 15, further comprising a latching spring, the latching spring being attached to the PCB, and a plurality of protrusions at a bottom end of the plastic knob element, wherein the latching spring engage between at least two of the protrusions.

17. The motion detection interface arrangement (10) according to claim 15, further comprising a latching spring and a latching element and a plurality of protrusions at a bottom end of the plastic knob element, wherein the latching spring is attached to the PCB, the latching element being arranged between the protrusion and the latching spring, and wherein the latching element engages between at least two of the protrusions.

18. The motion detection interface arrangement (10) according to claim 15, further comprising a wheel mounted on the PCB and a detector that detects a motion of the wheel, the wheel engaging with a gear on the knob element (14, 20) and the detector being electrically connected to a conductive path on the PCB.

19. A motion detection device comprising:
a motion detection interface arrangement (10) according to claim 15; and
an electronic evaluation unit (36) having a plurality of interface ports electrically connected with the conductive paths of the PCB.

20. The motion detection device according to claim 19, wherein the electronic evaluation unit is configured to detect an intentional hand contact by evaluating the strength and duration of signals from the electrode surfaces via the interface ports.

21. The motion detection device according to claim 19, wherein the electronic evaluation unit is configured to detect a finger position by evaluating signals from the electrode surfaces via the interface ports.

22. The motion detection device according to claim 19, wherein the electronic evaluation unit is configured to detect a rotational position of the knob element (14, 20) by detecting a short circuit between two of the electrode surfaces and by detecting the absence of a short circuit between electrode surfaces.

23. The motion detection device according to claim 19, wherein the electronic evaluation unit is configured to detect a rotational position of the knob element (14, 20) by evaluating an electric signal from a coil via conductive paths of the PCB, the coil being attached to the knob element (14, 20).

24. The motion detection device according to claim 19, wherein the electronic evaluation unit is configured to detect a rotational position of the knob element (14, 20) by evaluating an electric signal from a light detector via conductive paths of the PCB, the light detector being attached to the knob element (14, 20).

25. A vehicle with a motion detection device according to claim 19, wherein the motion detection device is integrated into an operating panel in a passenger compartment of the vehicle and wherein the electronic evaluation unit of the motion detection device is electrically connected to a device of the vehicle.

26. A method for producing a cylindrical capacitive sensor arrangement (11), comprising:
injection molding a first shot molded plastic part;
providing a platable plastic material;
injection molding a second shot molded plastic part from the platable plastic material using a mold form configured such that the second shot molding part has strip shaped platable regions (13);

plating the second shot molded plastic part in a metallization step; and providing electrical contacts (56-59; 60-63) to the strip shaped platable regions (13).

* * * * *